US009887678B2

(12) United States Patent
Masnadi Shirazi Nejad et al.

(10) Patent No.: US 9,887,678 B2
(45) Date of Patent: Feb. 6, 2018

(54) LINEAR LOW NOISE AMPLIFIER (71) Applicant: QUALCOMM Incorporated, San Diego, CA (US)

(72) Inventors: Amir Hossein Masnadi Shirazi Nejad, Vancouver (CA); Mazhareddin Taghivand, Campbell, CA (US); Seyed Hossein Miri Lavasani, Santa Clara, CA (US); Mohammad Emadi, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/174,856

(22) Filed: Jun. 6, 2016

(65) Prior Publication Data
US 2017/0179896 A1 Jun. 22, 2017

Related U.S. Application Data (60) Provisional application No. 62/271,143, filed on Dec. 22, 2015.

(51) Int. Cl.
H03G 1/00 (2006.01)
H03F 3/193 (2006.01)
H04W 84/12 (2009.01)

(52) U.S. Cl.
CPC .......... *H03G 1/0035* (2013.01); *H03F 3/193* (2013.01); *H03F 2200/294* (2013.01); *H03F 2200/451* (2013.01); *H03F 2200/75* (2013.01); *H04W 84/12* (2013.01)

(58) Field of Classification Search
CPC ............................... H03G 1/0035; H03F 3/193

USPC ......................................................... 330/278
See application file for complete search history.

(56) References Cited

U.S. PATENT DOCUMENTS

| 5,699,014 | A | 12/1997 | Haefner et al. |
| 6,975,848 | B2 | 12/2005 | Rawlins et al. |
| 7,088,187 | B1 | 8/2006 | Jin et al. |
| 7,332,963 | B2 | 2/2008 | Pelleriti |
| 8,102,209 | B2 | 1/2012 | Jang et al. |
| 8,639,193 | B2 | 1/2014 | Lee et al. |
| 2010/0055353 | A1 | 3/2010 | Cho et al. |
| 2013/0176077 | A1 | 7/2013 | Pai et al. |
| 2014/0184334 | A1 | 7/2014 | Nobbe et al. |

OTHER PUBLICATIONS

Hsieh HH., et al., "Design of Ultra-Low-Voltage RF Frontends With Complementary Current-Reused Architectures", IEEE Transactions on Microwave Theory and Techniques, IEEE Service Center, Piscataway, NJ, US, vol. 55, No. 7, Jul. 7, 2007 (Jul. 7, 2007), pp. 1445-1458, XP011187189, ISSN: 0018-9480, DOI:10.1109/TMTT.2007.900208.

(Continued)

*Primary Examiner* — Patricia T Nguyen
(74) *Attorney, Agent, or Firm* — Paradice and Li LLP/Qualcomm (57) ABSTRACT A linear low noise amplifier is disclosed. In at least one exemplary embodiment, the linear low noise amplifier may include a first metal oxide semiconductor field effect transistor (MOSFET) configured to operate in a triode mode coupled to a second MOSFET configured to operate in a saturation mode. Linearity of the low noise amplifier may be determined, at least in part, by a transconductance associated with the second MOSFET and a channel resistance associated the first MOSFET.

24 Claims, 8 Drawing Sheets (56) References Cited

OTHER PUBLICATIONS

International Search Report and Written Opinion—PCT/US2016/063060—ISA/EPO—dated Feb. 8, 2017.
Kim BK., et al., "A Highly Linear GHz 1.3 dB NF CMOS Low-Noise Amplifier With Complementary Transconductance Linearization," IEEE Journal of Solid-State Circuits, IEEE Service Center, Piscataway, NJ, USA, vol. 49, No. 6, Jun. 6, 2014 (Jun. 6, 2014), pp. 1286-1382, XP011549323, ISSN: 0018-9200, DOI: 10.1109/JSSC.2014.2319262.
Zhang H., et al., "Linearization Techniques for CMOS Low Noise Amplifiers: A Tutorial", IEEE Transactions on Circuits and Systems I: Regular Papers, IEEE, US, vol. 58, No. 1, Jan. 1, 2011 (Jan. 1, 2011), pp. 22-36, XP011340986,ISSN: 1549-8328, DOI: 10.1109/TCSI.2010.2055353.

LINEAR LOW NOISE AMPLIFIER

CROSS-REFERENCE TO RELATED APPLICATION

This application claims priority to U.S. Provisional Patent Application No. 62/271,143 entitled "LINEAR LOW NOISE AMPLIFIER" filed Dec. 22, 2015, the entirety of which is incorporated by reference herein.

TECHNICAL FIELD

The exemplary embodiments relate generally to amplifiers, and specifically to linear low noise amplifiers.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

Analog signals within the wireless device may undergo amplification during various processing operations. For example, an analog signal may be amplified when an RF signal is received from or transmitted to another wireless device. In some cases, an unwanted signal may also be amplified. For example, as the received RF signal is amplified, a second signal, that may be a blocker signal or jammer signal, may also be amplified and may interfere with data recovery. This interference may be associated with amplifier linearity. For example, when a strong blocker or jammer signal is processed by an amplifier with relatively low linearity, then the blocker and/or jammer signal may saturate the amplifier and the RF signal may not adequately and/or accurately be amplified. Blocker and jammer signal rejection may be improved with amplifiers having relatively high linearity.

Thus, there is a need to improve the amplification of analog signals by extending the linearity of amplifiers, and thereby improve the performance of the wireless device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the disclosure are directed to apparatuses for extending the linearity of amplifiers. In one example, a low noise amplifier (LNA) includes a first transistor and a second transistor. The first transistor may be configured to operate in a triode mode. The second transistor may be configured to operate in a saturation mode as a common-source amplifier, and may include a complementary channel with respect to a channel of the first transistor. The second transistor may include a drain terminal coupled to a drain terminal of the first transistor. The second transistor also include a gate terminal configured to form an input terminal of the LNA.

In another example, an LNA includes a means for operating a first transistor in a triode mode and a means for operating a second transistor in a saturation mode as a common-source amplifier. The second transistor may include a complementary channel with respect to a channel of the first transistor. The means for operating the second transistor may include a means for forming an output terminal of the LNA, and a means for forming an input terminal of the LNA.

In another example, an apparatus is disclosed. The apparatus may include a first transistor and a second transistor. The first transistor may be configured to generate a variable resistance based, at least in part, on an input signal. The second transistor may be coupled to the first transistor and configured to amplify the input signal based, at least in part, on a transconductance of the second transistor and the variable resistance of the first transistor. The variable resistance of the first transistor may vary inversely with respect to the transconductance of the second transistor.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the example embodiments are equally applicable to devices using signals of other various wireless standards or protocols and/or devices using signals of various wired protocols. As used herein, the terms WLAN and Wi-Fi can include communications governed by the IEEE 802.11 standards, Bluetooth, HiperLAN (a set of wireless standards, comparable to the IEEE 802.11 standards, used primarily in Europe), and other technologies having relatively short radio propagation range. Thus, the terms "WLAN" and "Wi-Fi" may be used interchangeably herein.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all exemplary embodiments defined by the appended claims.

In addition, the detailed description set forth below in connection with the appended drawings is intended as a description of exemplary embodiments of the present disclosure and is not intended to represent the only exemplary embodiments in which the present disclosure may be practiced. The term "exemplary" used throughout this description means "serving as an example, instance, or illustration," and should not necessarily be construed as preferred or advantageous over other exemplary embodiments.

Further, combinations such as "at least one of A, B, or C," "at least one of A, B, and C," and "at least A or B or C or a combination thereof" include any combination of A, B, and/or C, and may include multiples of A, multiples of B, or multiples of C. Specifically, combinations such as "at least A or B or C or a combination thereof," "at least one of A, B, or C," "at least one of A, B, and C," "and "A, B, C, or any combination thereof" may be A only, B only, C only, A and B, A and C, B and C, or A and B and C, where any such combinations may contain one or more member or members of A, B, or C.

Figure 1:
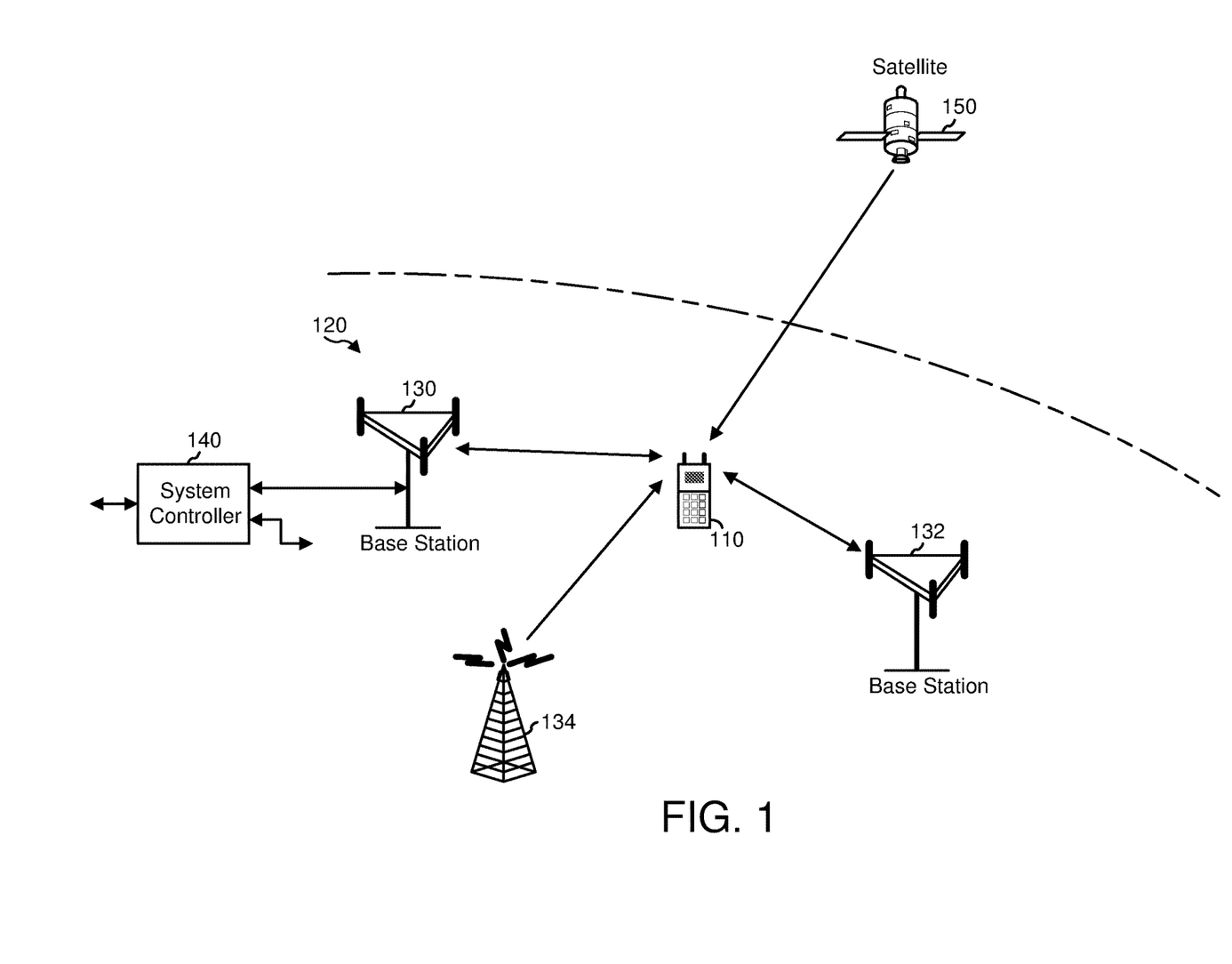
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a 3rd Generation Partnership Program (3GPP) Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Figure 2:
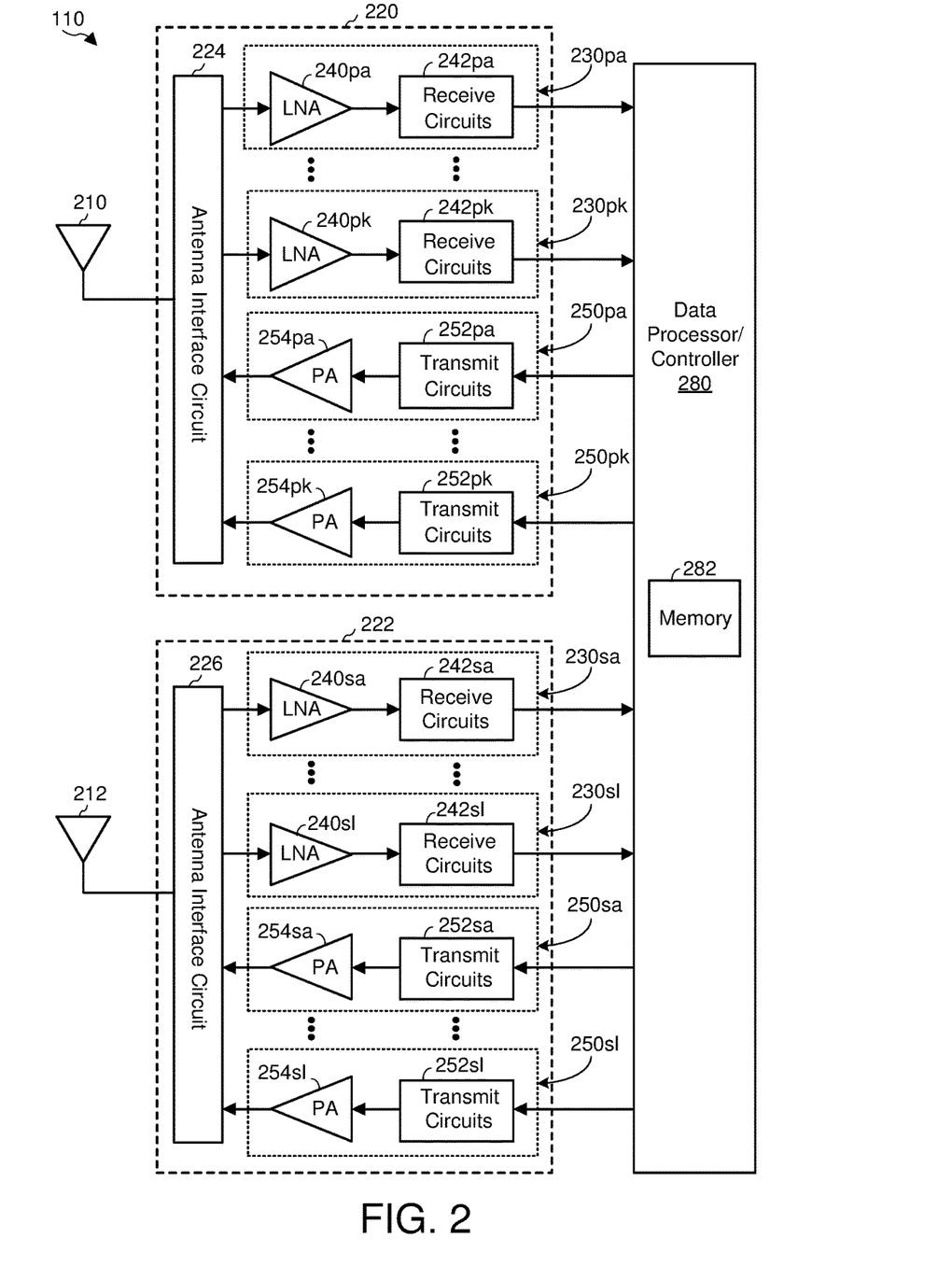
FIG. 2 shows an exemplary design of a receiver and a transmitter of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 (e.g., 230pa-230pk and 230sa-230sl) includes a low noise amplifier (LNA) 240 (e.g., 240pa-240pk and 240sa-240sl) and receive circuits 242 (e.g., 242pa-242pk and 242sa-242sl). For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in primary transceiver 220 (e.g., 230pk) may operate in a similar manner as receiver 230pa. The receivers 230 in transceiver 222 (e.g., 230sa-230sl) may operate in a similar manner as receiver 230pa.

In the exemplary design shown in FIG. 2, each transmitter 250 (e.g., 250pa-250pk and 250sa-250sl) includes transmit circuits 252 (e.g., 252pa-252pk and 252sa-252sl) and a power amplifier (PA) 254 (e.g., 254pa-254pk and 254sa-254sl). For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
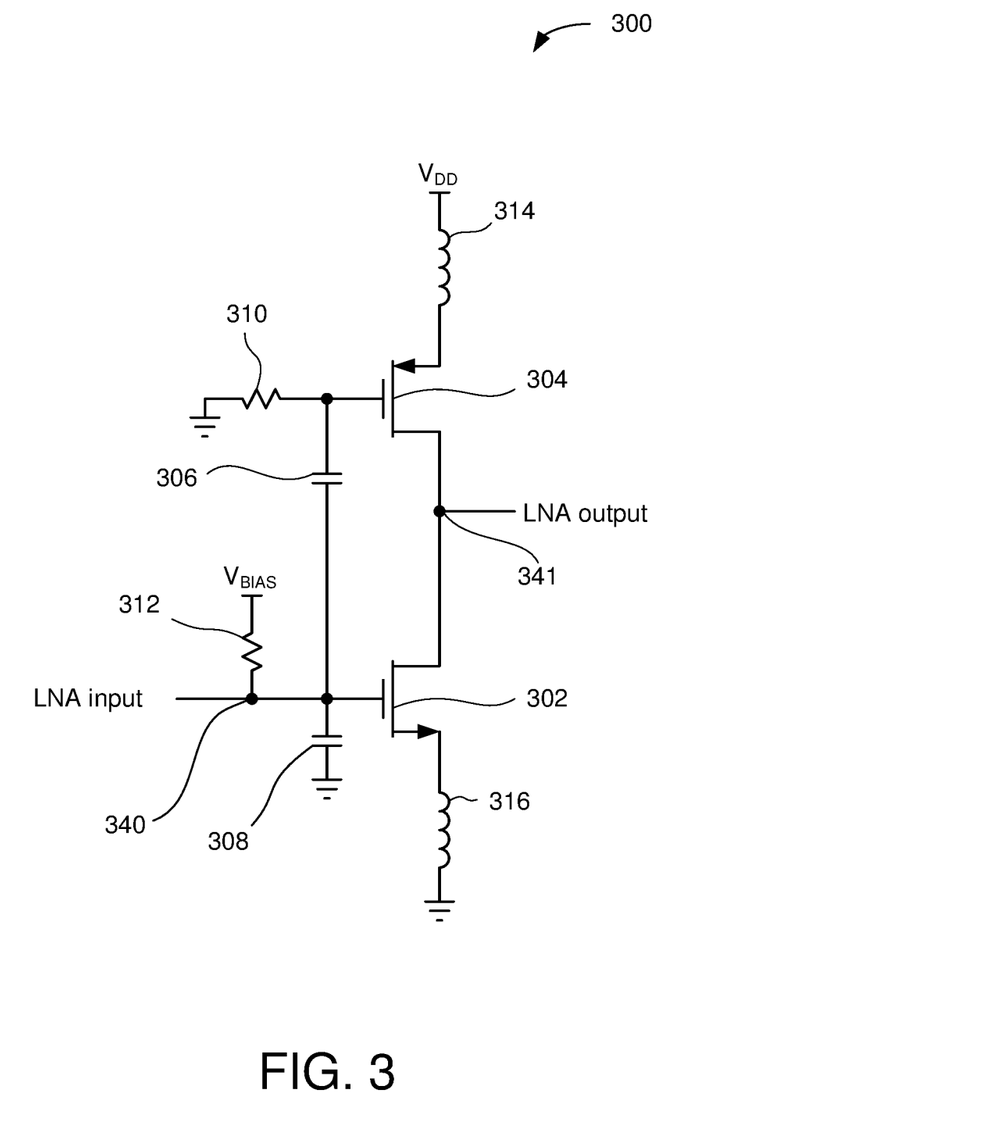
FIG. 3 is a circuit diagram of an exemplary embodiment of a low noise amplifier.

FIG. 3 is a circuit diagram of an exemplary embodiment of a low noise amplifier (LNA) 300. LNA 300 may be another exemplary embodiment of LNA 240p and/or LNA 240s of FIG. 2. In other exemplary embodiments, LNA 300 may be included within PA 254p, PA 254s, or any other technically feasible circuits within wireless device 110. LNA 300 may include an NMOS transistor 302, a PMOS transistor 304, a first capacitor 306, a second capacitor 308, a first resistor 310, a second resistor 312, a first inductor 314, and a second inductor 316.

Input signals to LNA 300 may be received at node 340 (e.g., node 340 may be an input terminal for LNA 300). A first terminal of second resistor 312, a first terminal of first capacitor 306, a first terminal of second capacitor 308, and a gate terminal of NMOS transistor 302 may also be coupled to node 340. A second terminal of second resistor 312 may be coupled to a bias voltage $V_{BIAS}$. In some exemplary embodiments, second resistor 312 may have, for example, a value of 10,000 ohms (for other embodiments, second resistor 312 may have other suitable resistances). Second resistor 312 and bias voltage $V_{BIAS}$ may bias NMOS transistor 302 to operate in a saturation mode. A source terminal of NMOS transistor 302 may be coupled to ground though second inductor 316. In some exemplary embodiments, when NMOS transistor 302 operates in the saturation mode, second inductor 316 may operate as a degeneration inductor to increase, at least in part, the linearity of LNA 300.

A second terminal of first capacitor 306 may be coupled to a gate terminal of PMOS transistor 304. In some exemplary embodiments, first capacitor 306 may have a value of, for example, 1 pF and may couple input signals to the gate terminal of PMOS transistor 304 (e.g., by AC coupling input signals from the gate terminal of NMOS transistor 302 to the gate terminal of PMOS transistor 304). For other embodiments, first capacitor 306 may have other suitable capacitances. The gate terminal of PMOS transistor 304 may also be coupled to ground through first resistor 310. In some exemplary embodiments, first resistor 310 may have a value of, for example, 10,000 ohms (for other embodiments, first resistor 310 may have other suitable resistances). First resistor 310 may bias, at least in part, PMOS transistor 304 to operate in a triode or deep triode mode. A source terminal of PMOS transistor 304 may be coupled to a power supply ($V_{DD}$) through first inductor 314. In some exemplary embodiments, the power supply may be, for example, 2.5 volts. First inductor 314 may allow output signals from LNA 300 to exceed, at least temporarily, the power supply voltage. Power supply voltages, resistive values, and capacitive values are provided to demonstrate the operation and advantages of the embodiments, and are not meant to limit the scope of the claims. A drain terminal of PMOS transistor 304 may be coupled to a drain terminal of NMOS transistor 302 at node 341. Node 341 may also be an output terminal of LNA 300.

In some exemplary embodiments, when PMOS transistor 304 operates in the deep triode mode, PMOS transistor 304 may operate as a variable resistor having a resistance determined, at least in part, by a gate voltage of PMOS transistor 304. As described above, NMOS transistor 302 and PMOS transistor 304 may be complementary transistors (e.g., metal oxide semiconductor field effect transistors (MOSFETs) with complementary channels). In some embodiments, a gain of LNA 300 may be determined, at least in part, by a transconductance provided by NMOS transistor 302 operating in the saturation mode and the equivalent resistance provided by PMOS transistor 304 operating in the deep triode mode. The gain of LNA 300 is described in more detail below in conjunction with FIG. 4.

Figure 4:
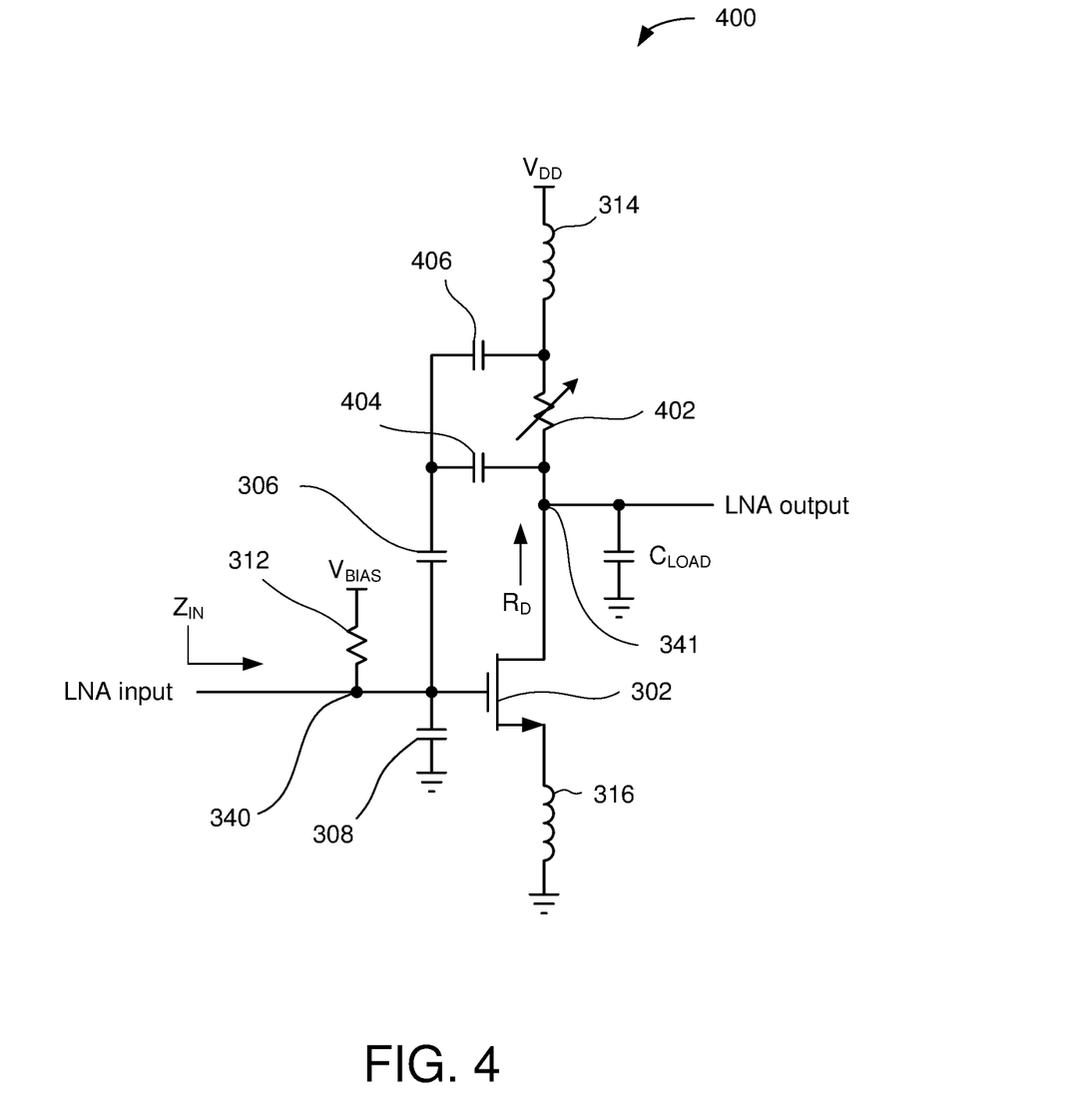
FIG. 4 is an equivalent circuit diagram of the low noise amplifier of FIG. 3.

FIG. 4 is an equivalent circuit diagram 400 of the LNA 300 of FIG. 3. In the equivalent circuit diagram 400, PMOS transistor 304 is replaced with electrical components that describe PMOS transistor 304 operating in the deep triode mode. Deep triode mode operation conditions for a transistor may be characterized by a drain-to-source voltage $V_{DS} \ll (2V_{GS}$-threshold voltage $V_{TH})$. For a PMOS transistor, such as PMOS transistor 304, deep triode mode operation conditions may be characterized by $|V_{DS\text{-}PMOS}| \ll |2V_{GS\text{-}PMOS} - V_{TH\text{-}PMOS}|$. In some exemplary embodiments, the circuit equivalent of PMOS transistor 304 may be modeled with a first variable resistor 402, a first parasitic capacitor 404, and a second parasitic capacitor 406. Thus, NMOS transistor 302, first inductor 314, second inductor 316, first capacitor 306, node 340, node 341, second capacitor 308, and second resistor 312 may be similarly configured as described above with respect to FIG. 3.

As described above with respect to FIG. 3, when a transistor operates in the deep triode mode, operation of the transistor may be modeled by a variable resistor. The variable resistor may be controlled, at least in part, by a gate voltage of the transistor. In addition to first variable resistor 402, the transistor model may include one or more parasitic capacitors (e.g., first parasitic capacitor 404 and second parasitic capacitor 406) to represent parasitic capacitors associated with source and drain terminals of the transistor.

In some exemplary embodiments, NMOS transistor 302 may be configured to operate as a common-source amplifier when biased to operate in the saturation mode. Those skilled in the art will appreciate that the gain of an NMOS transistor (and therefore the gain of the common-source amplifier and/or LNA 300) may be determined by a transconductance $Gm_{NMOS}$ associated with the NMOS transistor 302, and a resistive load at the drain terminal of the NMOS transistor ($R_{D\text{-}NMOS}$). In some exemplary embodiments, a gain of NMOS transistor 302 may be expressed by equation 1, below:

$$V_{OUT} = V_{IN}(Gm_{NMOS} * R_{D\text{-}NMOS}) \quad \text{(eq. 1)}$$

Where: $Gm_{NMOS}$ is the transconductance of NMOS transistor 302; and $R_{D\text{-}NMOS}$ is the resistance at the drain terminal of NMOS transistor 302.

Thus, the $(Gm_{NMOS} * R_{D\text{-}NMOS})$ term may be referred to as a gain (e.g., transfer function) of the LNA 300.

Transconductance is a ratio of a change in current with respect to a change in voltage responsible for the change in current. The transconductance $Gm_{NMOS}$ of NMOS transistor 302 in saturation may be expressed by equation 2, below:

$$Gm_{NMOS} = (CONST_{NMOS})(V_{GS\text{-}NMOS} - V_{TH\text{-}NMOS}) \quad \text{(eq. 2)}$$

Where: $CONST_{NMOS}$ is a constant associated with NMOS transistor 302 (e.g., a constant value associated with physical characteristics of NMOS transistor 302, such as channel width, channel length, and oxide capacitance (Cox));

$V_{GS\text{-}NMOS}$ is a voltage difference between gate and source terminals of NMOS transistor 302; and $V_{TH\text{-}NMOS}$ is the threshold voltage of NMOS transistor 302.

In the equivalent circuit diagram 400, the resistance $R_{D\text{-}NMOS}$ is provided by first variable resistor 402 and first inductor 314. For certain values of inductance provided by first inductor 314 (e.g., impedance values based, at least in part, on the inductance of the first inductor 314), the resistance $R_{D\text{-}NMOS}$ may be dominated by the resistance value of first variable resistor 402. In other words, the resistance value of a variable resistance provided by PMOS transistor 304 may be substantially larger than the impedance of the first inductor 314. For a PMOS transistor operating in the deep triode mode, equivalent resistance of the PMOS transistor (PMOS channel resistance R) may be approximated by equation 3, below:

$$R \approx \frac{1}{|V_{GS\text{-}PMOS} - V_{TH\text{-}PMOS}|(CONST_{PMOS})} \quad \text{(eq. 3)}$$

Where: $V_{GS\text{-}PMOS}$ is a voltage difference between gate and source terminals of the PMOS transistor;

$V_{TH\text{-}PMOS}$ is a threshold voltage of the PMOS transistor 304; and $CONST_{PMOS}$ is a constant associated with the PMOS transistor 304 (e.g., a constant value associated with physical characteristics of PMOS transistor 304 such as channel width, channel length, and oxide capacitance (Cox)).

Thus, the resistance value of first variable resistor 402 may be approximated as a function of $V_{GS\text{-}PMOS}$, $V_{TH\text{-}PMOS}$, and $CONST_{PMOS}$. Note that for typical PMOS transistors, VGS and VTH are often negative numbers (<0 volts); however, the absolute value function in the denominator of equation 3 may accommodate the negative values.

As described above, the resistance of first variable resistor 402 may be inversely proportional to the gate voltage of PMOS transistor 304 (see equation 3). For example, as the gate voltage of PMOS transistor 304 increases, then the resistance of first variable resistor 402 may decrease. In a similar manner, as the gate voltage of PMOS transistor 304 decreases, then the resistance of the first variable resistor 402 may increase. The transconductance $Gm_{NMOS}$ may be directly proportional to the gate voltage of NMOS transistor 302 (see equation 2). For example, as the gate voltage of NMOS transistor 302 increases, then the transconductance $Gm_{NMOS}$ may increase. In a similar manner, as the gate voltage of NMOS transistor 302 decreases, then the transconductance $Gm_{NMOS}$ may decrease. Note, as described above with respect to FIG. 3, input signals are coupled both to the gate of NMOS transistor 302 and the gate of PMOS transistor 304 through first capacitor 306. Thus, as LNA input signals increase (in magnitude) then the transconductance $Gm_{NMOS}$ may increase and the resistance $R_{D\text{-}NMOS}$ may decrease. Furthermore, as LNA input signals decrease, then the transconductance $Gm_{NMOS}$ may decrease and the resistance $R_{D\text{-}NMOS}$ may decrease.

In some embodiments, overall gain of LNA 300 may be made linear or substantially linear by controlling the transconductance $Gm_{NMOS}$ and the resistance $R_{D\text{-}NMOS}$ (e.g., the equivalent channel resistance of PMOS transistor 304) such that the transconductance $Gm_{NMOS}$ is inversely related to the resistance $R_{D\text{-}NMOS}$. In other words, the gain of LNA 300 may be made linear when the transconductance $Gm_{NMOS}$ is made to vary inversely with respect to resistance $R_{D\text{-}NMOS}$. Since $V_{out}$ of NMOS transistor 302 may be described as a product of the transconductance $Gm_{NMOS}$ and the resistance $R_{D\text{-}NMOS}$ (see equation 1), the output of NMOS transistor 302 (and therefore the overall gain of LNA 300) may be substantially linear when the transconductance $Gm_{NMOS}$ varies inversely with respect to the resistance $R_{D\text{-}NMOS}$. Persons having skill in the art will recognize that a device (e.g., LNA 300) may have a linear or substantially linear output when the output or gain of the device may be expressed by a polynomial function with a degree of zero (e.g., a constant) or one (e.g., a function of an independent variable raised to the first power).

In some embodiments, $CONST_{NMOS}$ and $CONST_{PMOS}$ may be controlled by setting physical parameters (e.g., channel width, channel length, Cox etc.) of NMOS transistor 302 and/or PMOS transistor 304 to cause the transconductance $Gm_{NMOS}$ to have an inverse relationship to the resistance $R_{D\text{-}NMOS}$. Thus, the linearity of LNA 300 may be determined, at least in part, by characteristics of NMOS transistor 302 and/or PMOS transistor 304. Linearity of LNA 300 is described in more detail below in conjunction with FIG. 5.

In some exemplary embodiments, the input impedance $(Z_{IN})$ of LNA 300 may be determined, at least in part, by the transconductance $Gm_{NMOS}$, second capacitor 308, and a load capacitance $C_{LOAD}$. Load capacitance $C_{LOAD}$ may be a capacitive load as seen from node 341 of LNA 300. In some exemplary embodiments, the input impedance of LNA 300 may be expressed by equation 4, shown below:

$$Z_{IN} \propto \frac{1}{GmNMOS} * \frac{C308 + C_{LOAD}}{C308} \quad \text{(eq. 4)}$$

Where: $Gm_{NMOS}$ is the transconductance of NMOS transistor 302;

$C308$ is the capacitance value of second capacitor 308; and $C_{LOAD}$ is the capacitance value as seen from node 341. Thus, for some exemplary embodiments, the input impedance $Z_{IN}$ may be controlled, at least in part, by selecting values for second capacitor 308.

Figure 5:
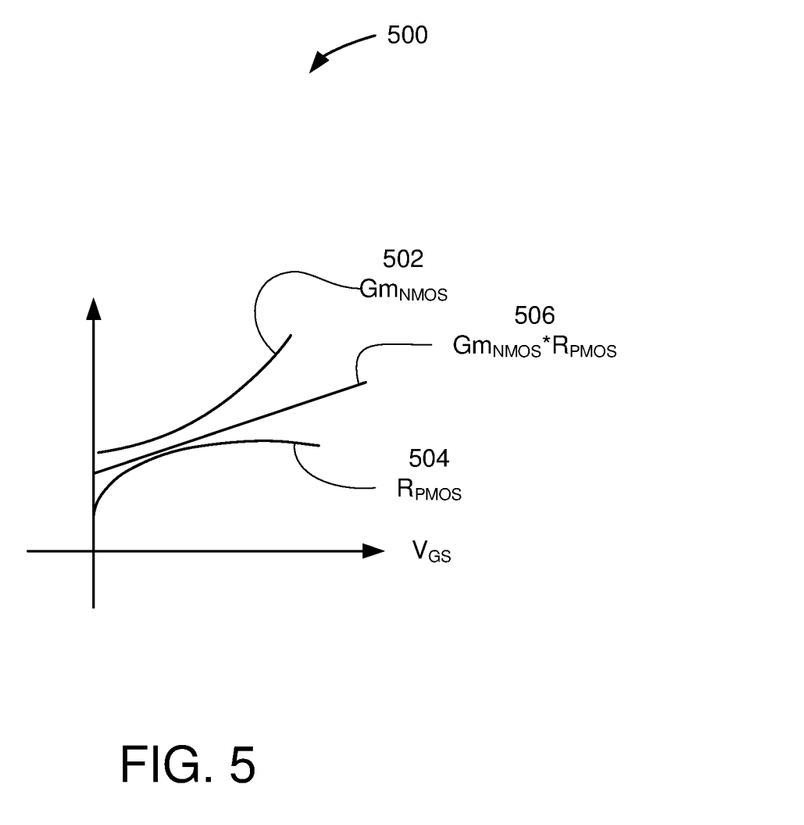
FIG. 5 is a graph depicting exemplary $R_{PMOS}$ and $Gm_{NMOS}$ curves for the PMOS transistor and the NMOS transistor of FIG. 3.

FIG. 5 is a graph 500 depicting exemplary $R_{PMOS}$ and $Gm_{NMOS}$ curves for PMOS transistor 304 and NMOS transistor 302, respectively. $R_{PMOS}$ curve 504 may illustrate resistance values of first variable resistor 402 as determined by changes to the gate-to-source voltage $V_{GS\text{-}PMOS}$ of PMOS transistor 304.

In a similar manner, $Gm_{NMOS}$ curve 502 may illustrate conductance values of the transconductance $Gm_{NMOS}$ associated with changes to the gate-to-source voltage $V_{GS\text{-}NMOS}$ of NMOS transistor 302. When $R_{PMOS}$ curve 504 and $Gm_{NMOS}$ curve 502 have an inverse characteristic with respect to each other, then a substantially linear gain for LNA 300 (as expressed by equation 1) may be obtained as illustrated with $Gm_{NMOS}*R_{PMOS}$ curve 506. In other words, the product of $Gm_{NMOS}*R_{PMOS}$ may be substantially linear, with respect to a gate voltage. Thus, the gain for LNA 300 may be substantially linear.

In some exemplary embodiments, linearity of an amplifier may be characterized by an "IIP3" value. Those skilled in the art will recognize that IIP3 refers to a Third Order Intercept Point. The IIP3 may be operating point of an amplifier when power in the third-order product of the amplified signal and the fundamental tone of the amplified signal intersect. In some exemplary embodiments, IIP3 of LNA 300 may be greater than, for example, 15 dBm, and in some instances greater than or equal to, for example, 24 dBm. The IIP3 ranges are provided to demonstrate the operation and advantages of the embodiments and are not meant to limit the scope of the claims.

In other embodiments, an LNA may include an NMOS transistor configured to operate in the deep triode mode and a PMOS transistor configured to operate in the saturation mode. The gain of such a configuration may be determined, at least in part, by a transconductance provided by the PMOS transistor and an equivalent resistance provided the NMOS transistor. An exemplary LNA is described below in conjunction with FIGS. 6-8.

Figure 6:
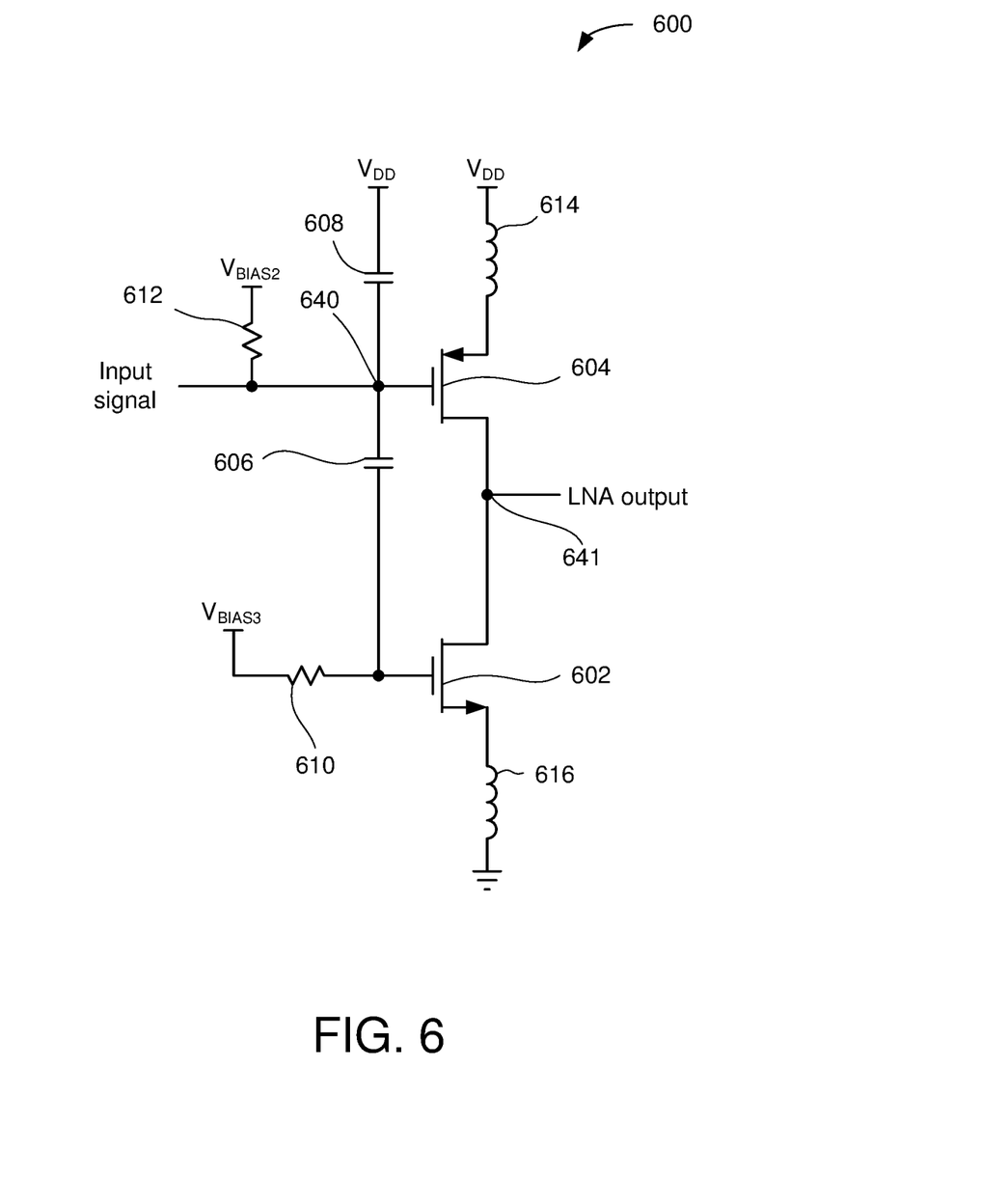
FIG. 6 is a circuit diagram of another exemplary embodiment of a low noise amplifier.

FIG. 6 is a circuit diagram of another exemplary embodiment of an LNA 600. LNA 600 may be another embodiment of LNA 300 of FIG. 3. LNA 600 may include an NMOS transistor 602, a PMOS transistor 604, a third capacitor 606, a fourth capacitor 608, a third resistor 610, a fourth resistor 612, a third inductor 614, and a fourth inductor 616.

Input signals to LNA 600 may be received at node 640 (e.g., node 640 may be an input terminal for LNA 600). A first terminal of fourth resistor 612, a first terminal of third capacitor 606, a first terminal of fourth capacitor 608, and a gate terminal of PMOS transistor 604 may also be coupled to node 640. A second terminal of fourth resistor 612 may be coupled to a bias voltage $V_{BIAS2}$. Fourth resistor 612 and bias voltage $V_{BIAS2}$ may bias PMOS transistor 604 to operate in the saturation mode. A source terminal of PMOS transistor 604 may be coupled to $V_{DD}$ though third inductor 614. In some exemplary embodiments, when PMOS transistor 604 operates in the saturation mode, third inductor 614 may operate as a degeneration inductor to increase, at least in part, the linearity of LNA 600.

A second terminal of third capacitor 606 may be coupled to a gate terminal of NMOS transistor 602. In some exemplary embodiments, third capacitor 606 may couple input signals to the gate terminal of NMOS transistor 602 (e.g., by AC coupling input signals from the gate terminal of PMOS transistor 604 to the gate terminal of NMOS transistor 602). The gate terminal of NMOS transistor 602 may also be coupled to bias voltage $V_{BIAS3}$ through third resistor 610. Third resistor 610 may bias, at least in part, NMOS transistor 602 to operate in a deep triode mode. A source terminal of NMOS transistor 602 may be coupled to ground through fourth inductor 616. A drain terminal of PMOS transistor 604 may be coupled to a drain terminal of NMOS transistor 602 at node 641. Node 641 may also be an output terminal of LNA 600.

In some exemplary embodiments, when NMOS transistor 602 operates in the deep triode mode, NMOS transistor 602 may operate as a variable resistor having a resistance determined, at least in part, by a gate voltage of NMOS transistor 602. In some embodiments, a gain of LNA 600 may be determined, at least in part, by a transconductance provided by PMOS transistor 604 operating in the saturation mode and the equivalent resistance provided by NMOS transistor 602 operating in the deep triode mode. The gain of LNA 600 is described in more detail below in conjunction with FIG. 7.

Figure 7:
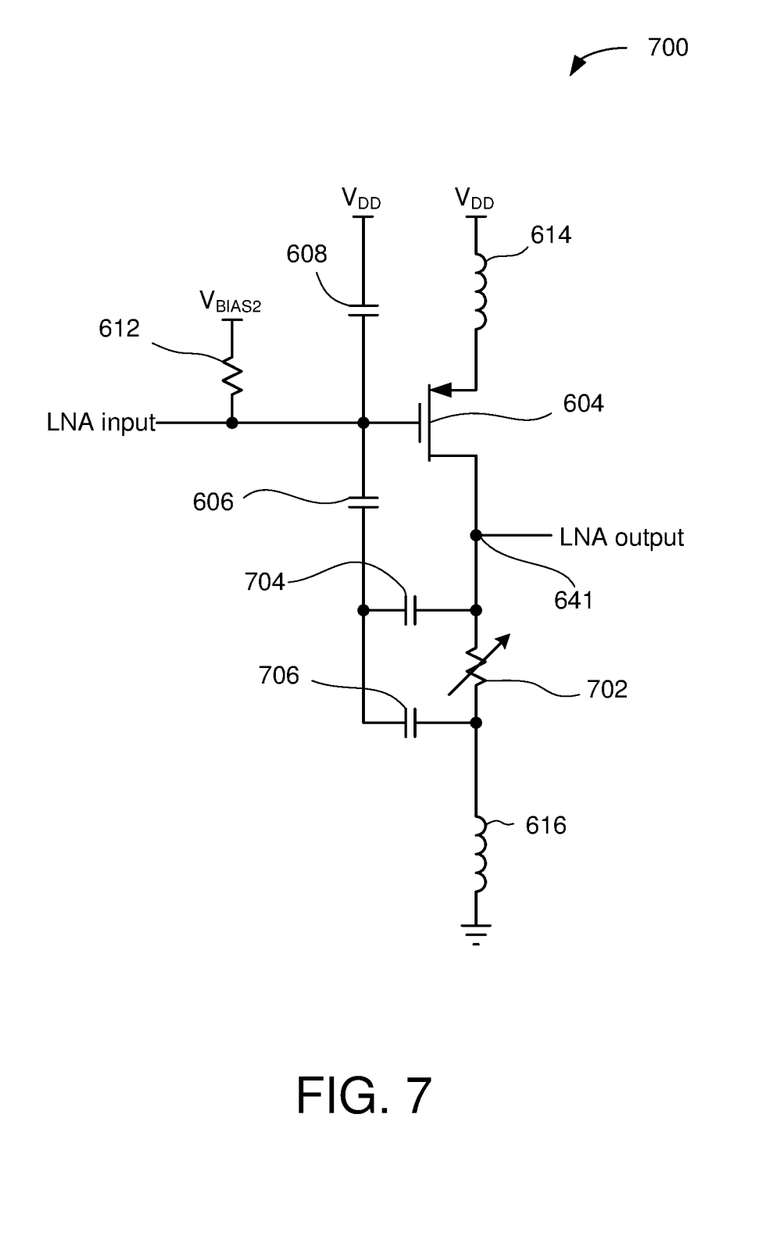
FIG. 7 is an equivalent circuit diagram of the low noise amplifier of FIG. 6.

FIG. 7 is an equivalent circuit diagram 700 of the LNA 600 of FIG. 6. In the equivalent circuit diagram 700, NMOS transistor 602 is replaced with electrical components that describe NMOS transistor 602 operating in the deep triode mode. For an NMOS transistor, such as NMOS transistor 602, deep triode mode operation conditions may be characterized by $(V_{DS-NMOS}) \ll (2V_{GS-NMOS} - V_{TH-NMOS})$. In some exemplary embodiments, the circuit equivalent of NMOS transistor 602 may be modeled with a second variable resistor 702, a third parasitic capacitor 704, and a fourth parasitic capacitor 706. Thus, PMOS transistor 604, third inductor 614, fourth inductor 616, third capacitor 606, node 640 (as shown in FIG. 6), node 641, fourth capacitor 608, and fourth resistor 612 may be similarly configured as described above with respect to FIG. 6.

Similar to the LNA 300, output of LNA 600 may be described as a function of a transconductance $Gm_{PMOS}$ of the PMOS transistor 604 and a resistance at the drain terminal of the PMOS transistor 604 as shown by equation 5, below:

$$V_{OUT} = V_{IN}(Gm_{PMOS}*R_{D-PMOS}) \quad \text{(eq. 5)}$$

Where: $Gm_{PMOS}$ is the transconductance of PMOS transistor 604; and $R_{D-PMOS}$ is the resistance at the drain terminal of PMOS transistor 604.

The transconductance $Gm_{PMOS}$ of PMOS transistor 604 in the saturation mode may be expressed by equation 6, below:

$$Gm_{PMOS} = (CONST_{PMOS})|V_{GS-PMOS} - V_{TH-PMOS}| \quad \text{(eq. 6)}$$

Where: The value $CONST_{PMOS}$ is a constant associated with PMOS transistor 604;

$V_{GS-PMOS}$ is a voltage difference between gate and source terminals of PMOS transistor 604; and $V_{TH-PMOS}$ is the threshold voltage of PMOS transistor 604.

Note that for typical PMOS transistors, VGS and VTH are often negative numbers (<0 volts); however, the absolute value function in equation 6 may accommodate the negative values.

In the equivalent circuit diagram 700, the resistance $R_{D-PMOS}$ is provided by second variable resistor 702 and fourth inductor 616. For certain values of inductance provided by fourth inductor 616, the resistance $R_{D-PMOS}$ may be dominated by the resistance value of second variable resistor 702. In other words, the resistance value of the variable resistance provided by NMOS transistor 602 may be substantially larger than the impedance of the fourth inductor 616. For an NMOS transistor operating in the deep triode mode, equivalent resistance of the NMOS transistor (NMOS channel resistance R) may be approximated by equation 7, below:

$$R \approx \frac{1}{|V_{GS-NMOS} - V_{TH-NMOS}|(CONST_{NMOS})} \quad \text{(eq. 7)}$$

Where: $V_{GS-NMOS}$ is a voltage difference between gate and source terminals of the NMOS transistor;

$V_{TH-NMOS}$ is a threshold voltage of the NMOS transistor; and $CONST_{NMOS}$ is a constant associated with the NMOS transistor.

Note that equations 1-7 described above may be approximations used to explain operations of one or more embodiments described herein and are not meant to limit the scope of the claims.

As described above, the resistance of second variable resistor 702 may be inversely proportional to the gate voltage of NMOS transistor 602 (see equation 7). For example, as the gate voltage of NMOS transistor 602 increases, then the resistance of second variable resistor 702 may decrease. In a similar manner, as the gate voltage of NMOS transistor 602 decreases, then the resistance of the second variable resistor 702 may increase. The transconductance $Gm_{PMOS}$ may be directly proportional to the gate voltage of PMOS transistor 604 (see equation 6). For example, as the gate voltage of PMOS transistor 604 increases, then the transconductance $Gm_{PMOS}$ may increase. In a similar manner, as the gate voltage of PMOS transistor 604 decreases, then the transconductance $Gm_{PMOS}$ may decrease. Note, as described above, input signals are coupled both to the gate of PMOS transistor 604 and the gate of NMOS transistor 602 through third capacitor 606. Thus, as LNA input signals increase (in magnitude) then the transconductance $Gm_{PMOS}$ may increase and the resistance $R_{D-PMOS}$ may decrease. Furthermore, as LNA input signals decrease, then the transconductance $Gm_{PMOS}$ may decrease and the resistance $R_{D-PMOS}$ may decrease.

In some embodiments, overall gain of LNA 600 may be made linear by controlling the transconductance $Gm_{PMOS}$ and the resistance $R_{D-PMOS}$ (e.g., the equivalent channel resistance of NMOS transistor 602) such that the transconductance $Gm_{PMOS}$ is substantially an inverse of the resistance $R_{D-PMOS}$. Since $V_{out}$ of PMOS transistor 604 may be described as a product of the transconductance $Gm_{PMOS}$ and the resistance $R_{D-PMOS}$ (see equation 5), then the output of PMOS transistor 604 and therefore overall gain of LNA 600 may be substantially linear when the transconductance $Gm_{PMOS}$ is substantially the inverse of the resistance $R_{D-PMOS}$.

Figure 8:
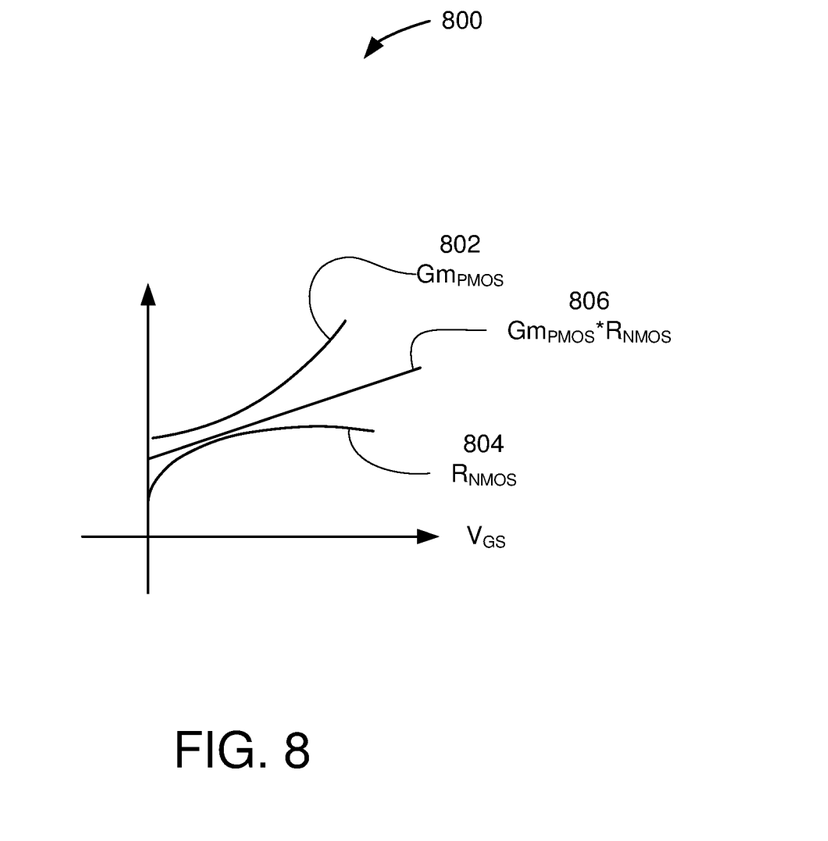
FIG. 8 is a graph depicting exemplary $R_{NMOS}$ and $Gm_{PMOS}$ curves for the NMOS transistor and PMOS transistor of FIG. 6.

FIG. 8 is a graph 800 depicting exemplary $R_{NMOS}$ and $Gm_{PMOS}$ curves for NMOS transistor 602 and PMOS transistor 604 of FIG. 6, respectively. $R_{NMOS}$ curve 804 may illustrate resistance values of second variable resistor 702 as determined by changes to the gate-to-source voltage $V_{GS-NMOS}$ of NMOS transistor 602. In a similar manner, $Gm_{PMOS}$ curve 802 may illustrate conductance values of the transconductance $Gm_{PMOS}$ associated with changes to the gate-to-source voltage $V_{GS-PMOS}$ of PMOS transistor 604. When $R_{NMOS}$ curve 804 and $Gm_{PMOS}$ curve 802 have an inverse characteristic with respect to each other, then a substantially linear gain for LNA 600 may be obtained as illustrated with $Gm_{PMOS}*R_{NMOS}$ curve 806. In other words, the product of $Gm_{PMOS}*R_{NMOS}$ may be substantially linear (e.g., $Gm_{PMOS}*R_{NMOS}$ may be a substantially linear function), with respect to a gate voltage. Thus, the gain for LNA 600 may be substantially linear.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A low noise amplifier (LNA) comprising:
   a first transistor configured to operate in a triode mode; and
   a second transistor configured to operate in a saturation mode as a common-source amplifier, the second transistor including a complementary channel with respect to a channel of the first transistor, the second transistor comprising:
      a drain terminal coupled to a drain terminal of the first transistor and configured to form an output terminal of the LNA; and
      a gate terminal configured to form an input terminal of the LNA, wherein a transconductance of the second transistor decreases when an LNA input signal increases and increases when the LNA input signal decreases.

2. The LNA of claim 1, wherein the first transistor is configured to provide a resistive load to the drain terminal of the second transistor.

3. The LNA of claim 2, wherein the resistive load is configured to increase as the LNA input signal increases and to decrease as the LNA input signal decreases.

4. The LNA of claim 2, wherein the resistive load is a voltage controlled resistance.

5. The LNA of claim 1, wherein a gain of the LNA is based, at least in part, on a channel resistance of the first transistor and the transconductance of the second transistor.

6. The LNA of claim 1, wherein a gain of the LNA is based, at least in part, on a polynomial function of the LNA input signal with a degree of one.

7. The LNA of claim 1, further comprising a capacitor coupled between the gate terminal of the second transistor and a gate terminal of the first transistor.

8. The LNA of claim 1, further comprising a first inductor coupled between a source terminal of the first transistor and a supply voltage.

9. The LNA of claim 8, wherein the first inductor is configured to generate an LNA output voltage greater than the supply voltage.

10. The LNA of claim 1, further comprising a second inductor coupled between a source terminal of the second transistor and ground.

11. The LNA of claim 1, further comprising a first resistor configured to bias the first transistor to operate in the triode mode.

12. The LNA of claim 1, further comprising a second resistor configured to bias the second transistor to operate in the saturation mode.

13. The LNA of claim 1, wherein the first transistor is a PMOS transistor and the second transistor is an NMOS transistor.

14. The LNA of claim 1, wherein the first transistor is an NMOS transistor and the second transistor is a PMOS transistor.

15. The LNA of claim 1, wherein the first transistor is configured to operate in a deep triode mode.

16. A low noise amplifier (LNA) comprising:
means for operating a first transistor in a triode mode; and
means for operating a second transistor in a saturation mode as a common-source amplifier, the second transistor including a complementary channel with respect to a channel of the first transistor, wherein the means for operating the second transistor is configured to:
couple a drain terminal of the second transistor to a drain terminal of the first transistor and form an output terminal of the LNA; and
form an input terminal of the LNA, wherein a transconductance of the second transistor decreases when an LNA input signal increases and increases when the LNA input signal decreases.

17. The LNA of claim 16, further comprising:
means for providing a resistive load for the second transistor.

18. The LNA of claim 17, wherein the resistive load is configured to increase as the LNA input signal increases and to decrease as the LNA input signal decreases.

19. The LNA of claim 17, further comprising:
means for generating a voltage controlled resistive load.

20. The LNA of claim 16, wherein a gain of the LNA is based, at least in part, on a polynomial function of the LNA input signal with a degree of one.

21. The LNA of claim 16, further comprising:
means for coupling the first transistor to a supply voltage.

22. An apparatus comprising:
a first transistor configured to generate a variable resistance based, at least in part, on an input signal; and
a second transistor, coupled to the first transistor, configured to amplify the input signal based, at least in part, on a transconductance of the second transistor and the variable resistance of the first transistor, wherein the variable resistance of the first transistor varies inversely with respect to the transconductance of the second transistor and the transconductance of the second transistor decreases as the input signal increases and increases as the input signal decreases.

23. The apparatus of claim 22, wherein the variable resistance is configured to increase as the input signal increases and to decrease as the input signal decreases.

24. The apparatus of claim 22, wherein a gain of the second transistor is based, at least in part, on a polynomial function of the input signal with a degree of one.

* * * * *